(12) United States Patent
Lidow et al.

(10) Patent No.: US 8,436,398 B2
(45) Date of Patent: May 7, 2013

(54) BACK DIFFUSION SUPPRESSION STRUCTURES

(75) Inventors: Alexander Lidow, Marina Del Ray, CA (US); Robert Beach, La Crescenta, CA (US); Guang Y. Zhao, Torrance, CA (US); Jianjun Cao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 209 days.

(21) Appl. No.: 12/756,088

(22) Filed: Apr. 7, 2010

(65) Prior Publication Data

US 2010/0258841 A1    Oct. 14, 2010

Related U.S. Application Data

(60) Provisional application No. 61/167,817, filed on Apr. 8, 2009.

(51) Int. Cl.
*H01L 31/102* (2006.01)
*H01L 29/66* (2006.01)

(52) U.S. Cl.
USPC ........... 257/189; 257/190; 257/191; 257/194; 257/285; 257/E29.245; 257/E21.403

(58) Field of Classification Search ............ 257/189, 257/190, 191, 194, 285, E29.245, E21.403
See application file for complete search history.

(56) References Cited

U.S. PATENT DOCUMENTS

| 6,849,882 | B2 | 2/2005 | Chavarkar et al. |
| 2005/0110054 | A1 | 5/2005 | Wohlmuth |
| 2005/0173728 | A1* | 8/2005 | Saxler .................... 257/192 |
| 2006/0273347 | A1 | 12/2006 | Hikita et al. |
| 2009/0050938 | A1 | 2/2009 | Miyoshi et al. |

OTHER PUBLICATIONS

X. Hu, et al., Enhancement Mode AlGaN/GaN HFET With Selectively Grown pn Junction Gate, *Electronics Letter*, vol. 36, No. 8, pp. 753-754 (Apr. 13, 2000).

Y. Uemoto et al., "Gate Injection Transistor (GIT)—A Normally—Off AlGaN/GaN Power Transistor using Conductivity Modulation", *IEEE Transactions on Electron Devices*, vol. 54, No. 12, pp. 3393-3399 (Dec. 2007).

T. Fujii et at. High On/Off Ratio in Enhancement-Mode $Al_xGa_{1-x}N$/GaN Junction Heterostructure Field-Effect Transistors with P-Type GaN Gate Contact, *Japanese Journal of Applied Physics*, vol. 45, No. 39, pp. L1048-L1050 (2006).

* cited by examiner

*Primary Examiner* — Michelle Mandala
(74) *Attorney, Agent, or Firm* — Dickstein Shapiro LLP

(57) ABSTRACT

An enhancement-mode GaN transistor, the transistor having a substrate, transition layers, a buffer layer comprised of a III Nitride material, a barrier layer comprised of a III Nitride material, drain and source contacts, a gate containing acceptor type dopant elements, and a diffusion barrier comprised of a III Nitride material between the gate and the buffer layer.

19 Claims, 15 Drawing Sheets

BACK DIFFUSION SUPPRESSION STRUCTURES

CROSS REFERENCE TO RELATED APPLICATIONS

This application claims priority from U.S. Provisional Application No. 61/167,817, filed on Apr. 8, 2009, which is hereby incorporated by reference in its entirety.

FIELD OF THE INVENTION

The present invention relates to the field of enhancement mode gallium nitride (GaN) transistors. More particularly, the invention relates to an enhancement mode GaN transistor with a diffusion barrier.

BACKGROUND OF THE INVENTION

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages, e.g., 100 Volts, while operating at high frequencies, e.g., 100 kHz-10 GHz.

A GaN HEMT device includes a nitride semiconductor with at least two nitride layers. Different materials formed on the semiconductor or on a buffer layer causes the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

FIG. 1 illustrates a conventional enhancement mode GaN transistor device 100 without a diffusion barrier. Device 100 includes substrate 101 that can be composed of silicon (Si), silicon carbide (SiC), sapphire, or other material, transition layers 102 typically composed of AlN and AlGaN that is about 0.1 to about 1.0 μm in thickness, buffer material 103 typically composed of GaN that is about 0.5 to about 10 μm in thickness, barrier material 104 typically composed of AlGaN where the Al to Ga ratio is about 0.1 to about 0.5 with thickness from about 0.005 to about 0.03 μm, p-type AlGaN 105, heavily doped p-type GaN 106, isolation region 107, passivation region 108, ohmic contact metals 109 and 110 for the source and drain, typically composed of Ti and Al with a capping metal such as Ni and Au, and gate metal 111 typically composed of a nickel (Ni) and gold (Au) metal contact over a p-type GaN gate.

There are several disadvantages of the conventional enhancement mode GaN transistors shown in FIG. 1. During growth of the p-type AlGaN 105 (in FIG. 1, for example) over the undoped GaN 103 or AlGaN 104, Mg atoms will diffuse back down the crystal into the active region of the device, leading to unintentional doping of layers 104 and 103. These Mg atoms act as acceptors, taking electrons, and become negatively charged. The negatively charged Mg repels electrons from the 2-dimensional electron gas. This leads to higher threshold voltage under the gate and lower conductivity in the region between the gate and the ohmic contacts. In addition, the charging and discharging of these Mg atoms can lead to time dependent changes in the threshold and conductivity of the device. A second disadvantage of the conventional GaN transistor is the high gate leakage when the transistor is turned on by applying positive voltage to the gate contact. During growth of layer 106 (in FIG. 1, for example), Mg atoms diffuse to the growth surface. When growth is terminated, a heavily doped layer exists at the surface. When positive bias is applied to the gate contact, a large current is generated due to the high doping at the top of this layer.

It would therefore be desirable to provide a GaN transistor with a diffusion suppression structure which avoids the above-mentioned disadvantages of the prior art.

DETAILED DESCRIPTION OF THE INVENTION

In the following detailed description, reference is made to certain embodiments. These embodiments are described with sufficient detail to enable those skilled in the art to practice them. It is to be understood that other embodiments may be employed and that various structural, logical, and electrical changes may be made.

Embodiments of the invention described herein relate to an enhancement mode GaN transistor with a diffusion barrier that prevents Mg atoms from diffusing through the crystal into the active regions of the device. The embodiments are based on the addition of a diffusion barrier and/or a graded doping profile to reduce or eliminate the diffusion of dopant atoms (e.g., Mg). In one embodiment of the current invention, a thin AlN, or high Al content AlGaN layer is deposited above the primary channel layer to block the back diffusion of Mg into this region. In another embodiment of the invention, a thin AlN or high Al AlGaN layer is deposited within or above the barrier layer. In another embodiment, the Mg doping profile is controlled to reduce the quantity of Mg diffused into or through the barrier layer by adding an undoped region between the p-GaN layer and barrier layer. In yet another embodiment, a doping modification near the gate contact is used either to facilitate ohmic or Schottky contact formation.

Figure 1:
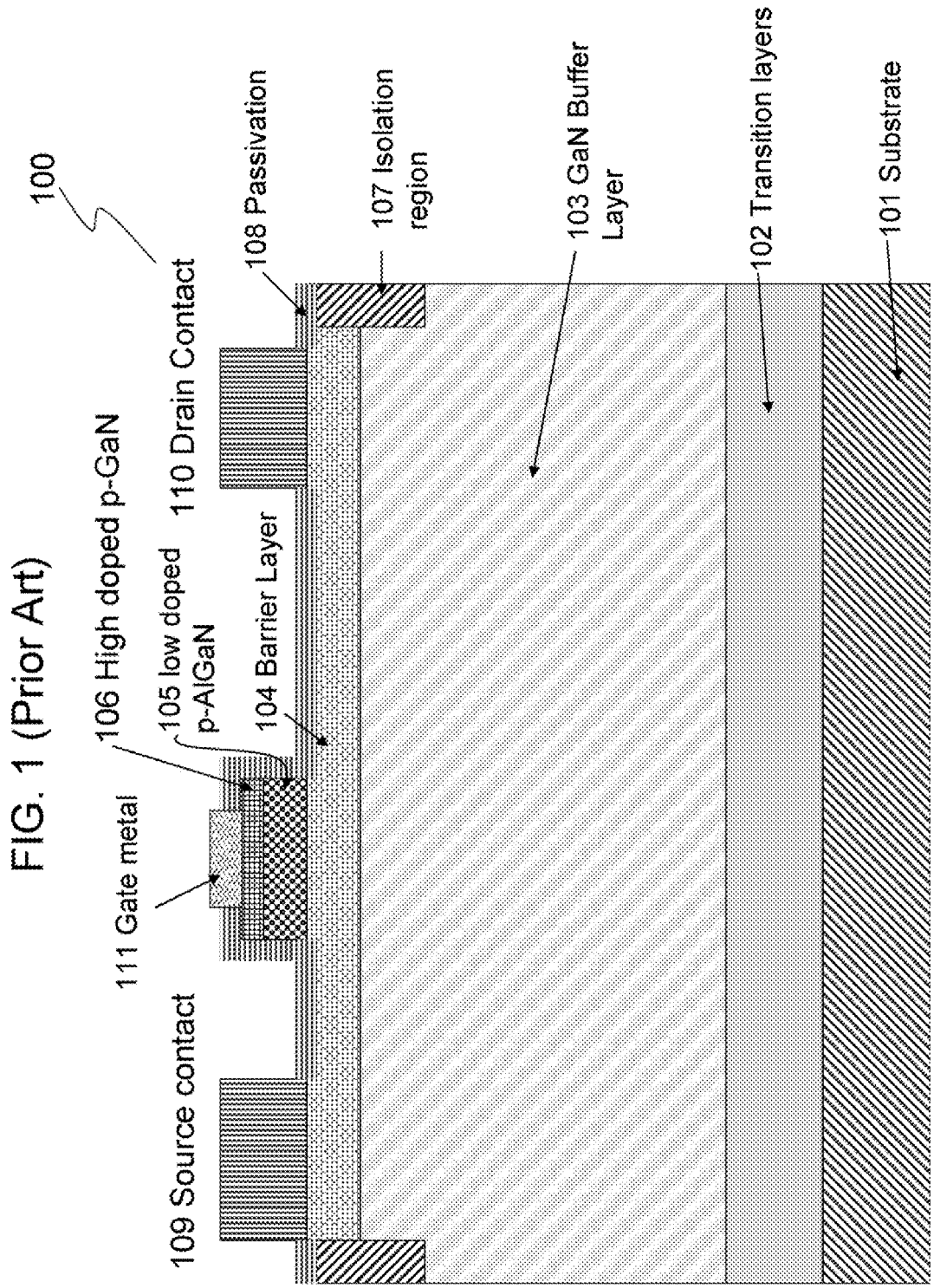
FIG. 1 illustrates a cross-sectional view of a conventional enhancement mode GaN transistor device.
Figure 2:
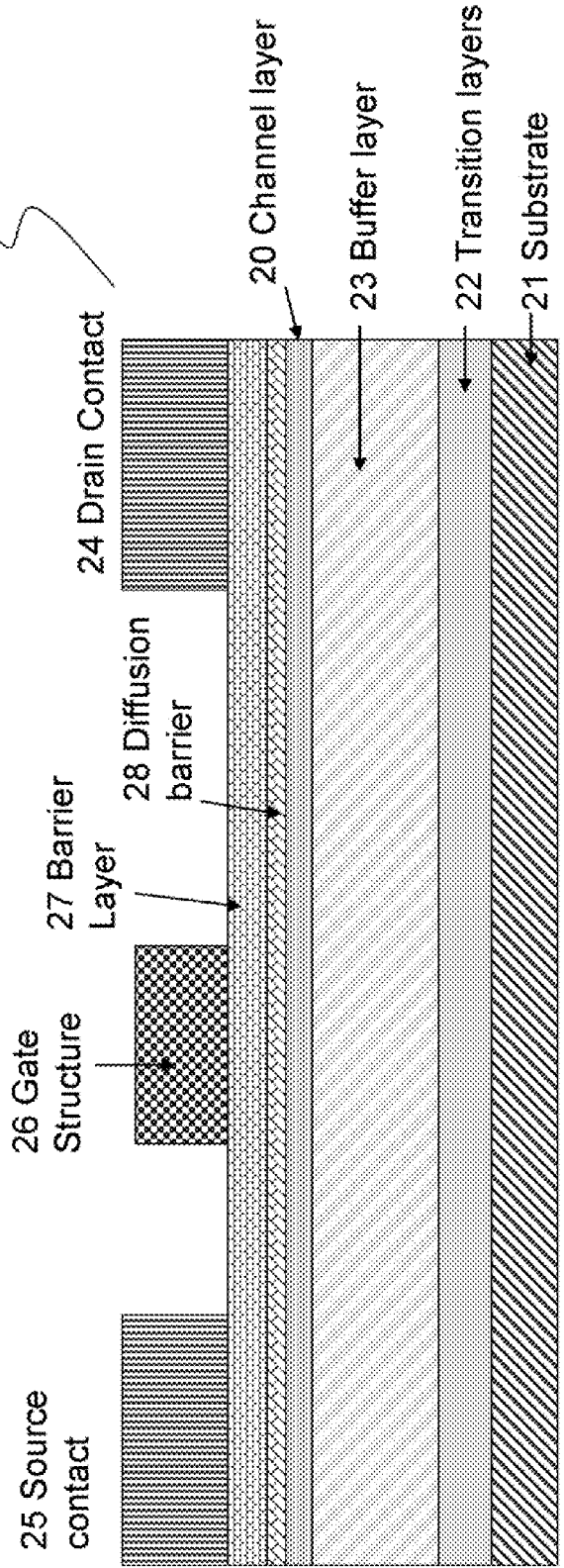
FIG. 2 illustrates a cross-sectional view of an enhancement mode GaN transistor device formed according to a first embodiment of the present invention.

Referring to FIG. 2, a first embodiment is now described with reference to the formation of an enhancement mode GaN transistor. FIG. 2 illustrates a cross-sectional view of the device 200. Device 200 includes substrate 21 composed of Si, SiC, sapphire, or other material, transition layers 22 typically composed of AlN and AlGaN from about 0.1 to about 1.0 μm in thickness, buffer layer 23 typically composed of GaN from about 0.5 to about 10 μm in thickness, channel layer 20 typically composed of GaN or InGaN with a thickness from about 0.01 to about 0.3 μm, barrier layer 27 typically composed of AlGaN where the Al fraction is about 0.1 to about 0.5 with a thickness between about 0.005 and about 0.03 μm, gate structure 26 typically composed of p-type GaN with a refractory metal contact such as Ta, Ti, TiN, W, or $WSi_2$. The p-type GaN and refractory metal contact are each between about 0.01 and about 1.0 μm in thickness. Ohmic contact metals 24, 25 are composed of Ti and Al with a capping metal such as Ni and Au or Ti and TiN. Diffusion barrier 28 is typically composed of AlGaN, where the Al fraction is between about 0.2 and about 1 with a thickness between about 0.001 and about 0.003 μm. The Al fraction is the content of Al such that Al fraction plus Ga fraction equals 1. Buffer layer 23, barrier layer 27, and diffusion barrier 28 are made of a III Nitride material. A III Nitride material can be composed of $In_xAl_yGa_{1-x-y}N$ where $x+y \leq 1$.

Figure 3:
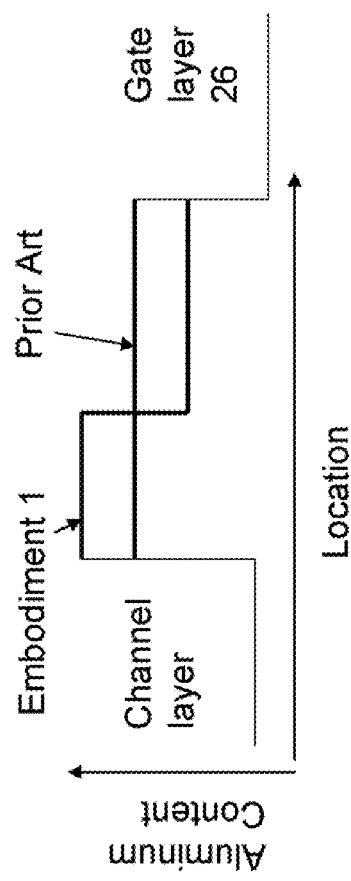
FIG. 3 is a schematic representation comparing the aluminum content in conventional GaN transistors and the device of FIG. 2.

In accordance with the above-described embodiment, a double layer of different Al contents is formed. The structure in FIG. 2 has higher Al content close to the channel layer, and lower Al content near the gate layer. A comparison of Al content between the channel layer and gate layer in a conventional GaN transistor and the structure of FIG. 2 is shown in FIG. 3. In the structure shown in FIG. 2, the diffusion barrier layer 28 above the channel layer is high in Al, while the barrier layer 27 is of lower Al content. Although FIG. 3 shows 2 distinct layers of constant Al content, the combination of layer 28 and 27 into a graded Al content layer can also be employed, such that the Al content is graded from high near the channel layer to low near the gate structure. This grading can be done in many fashions, such as linear, multiple steps down, alternating between high and low Al content while gradually decreasing the average Al content, or alternating between high and low Al content while changing the thickness of the high and low Al layers from thicker high Al near the channel to thinner high Al near the gate. The high Al content material blocks diffusion of Mg and confines it to regions above the channel layer. The high Al content layer also leads to high electron mobility. In the structure shown in FIG. 2, however, diffusion still proceeds into the top barrier layer.

Figure 4:
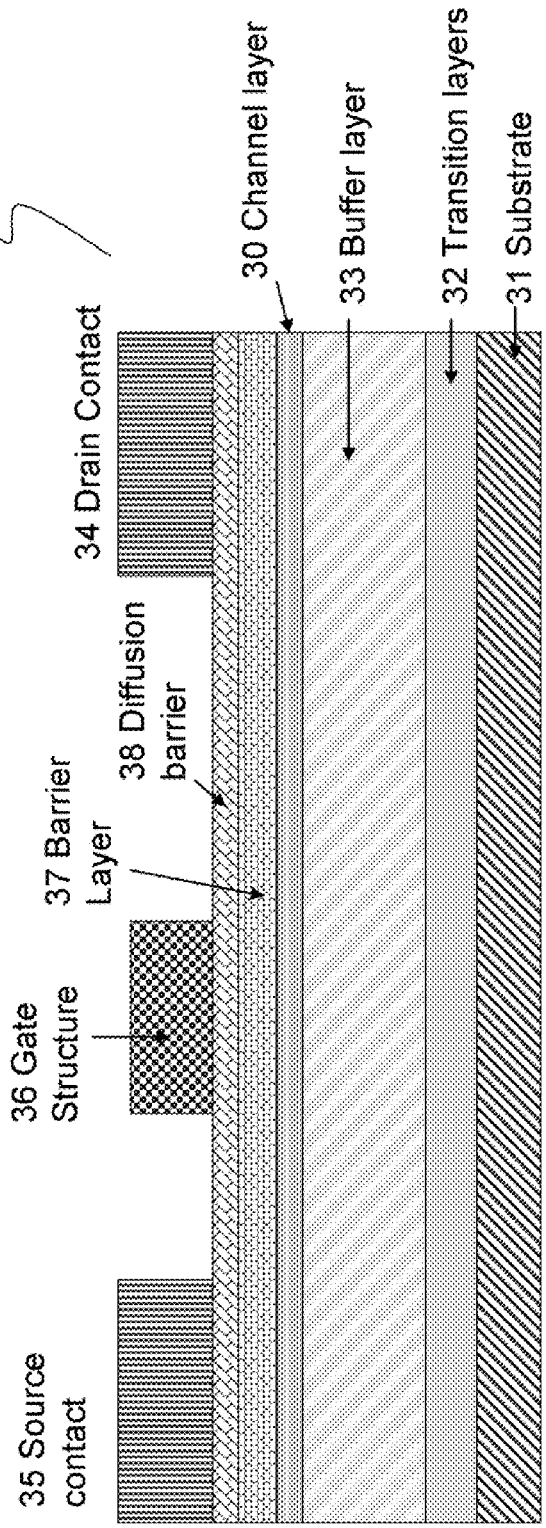
FIG. 4 illustrates a cross-sectional view of an enhancement mode GaN transistor device formed according to a second embodiment of the present invention.

Referring to FIG. 4, a second embodiment is now described with reference to the formation of an enhancement mode GaN transistor. FIG. 4 illustrates a cross-sectional view of the device 300. FIG. 4 is similar to FIG. 2, but differs in that diffusion barrier 38 and barrier layer 37 are inverted from their positions in FIG. 2, thus providing diffusion barrier 38 next to the gate structure 36. The dimensions and compositions of the various layers are similar to that of the first embodiment.

Figure 5:
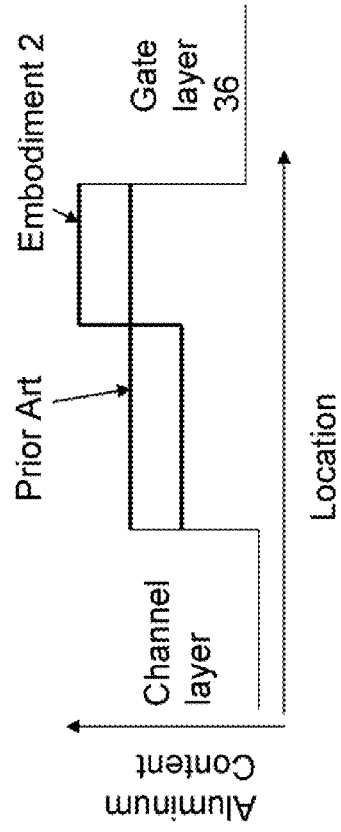
FIG. 5 is a schematic representation comparing the aluminum content in conventional GaN transistors and the device of FIG. 4.

In accordance with the above-described embodiment, a double layer of different Al contents is provided, with similar advantages as the first embodiment. A comparison of Al content between the channel layer and gate layer in a conventional GaN transistor and the structure of FIG. 4 is shown in FIG. 5. In the structure shown in FIG. 4, the barrier layer 37 above the channel layer is low in Al, while the diffusion barrier layer 38 is of higher Al content. The high Al content material blocks diffusion of Mg and confines it to regions above the barrier layers. In the structure shown in FIG. 4, however, the lower Al content layer does not have the advantage of higher electron mobility possessed by the first embodiment.

Figure 6:
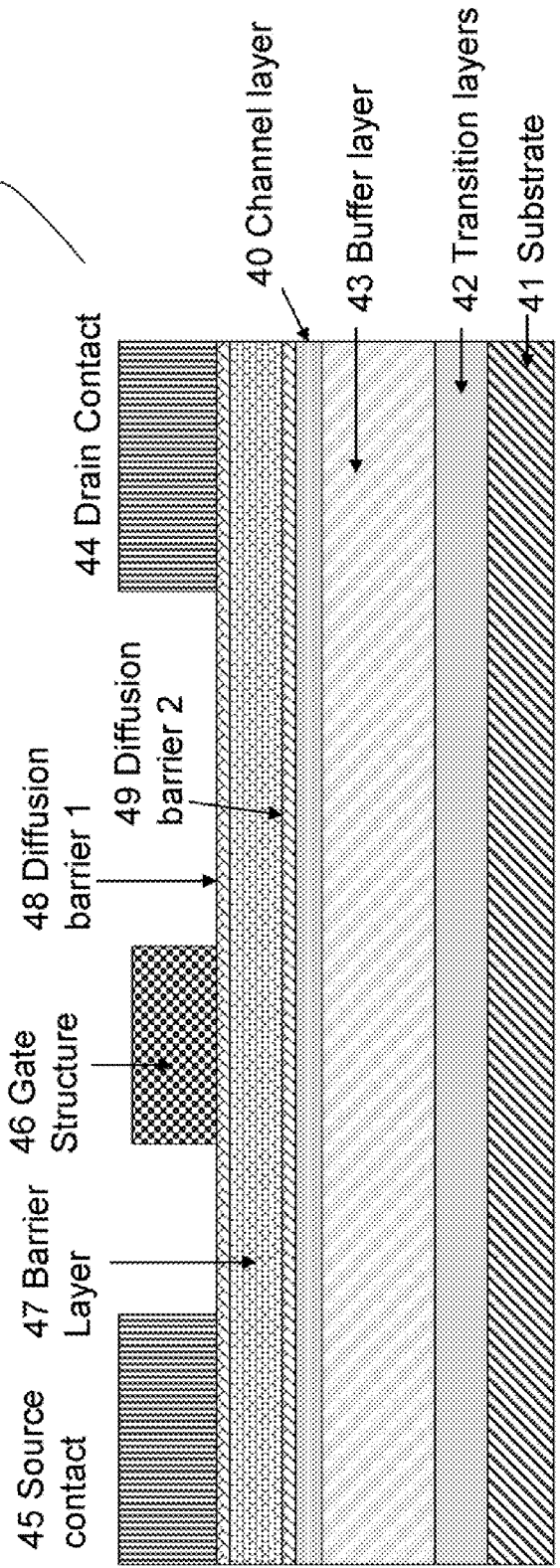
FIG. 6 illustrates a cross-sectional view of an enhancement mode GaN transistor device formed according to a third embodiment of the present invention.

Referring to FIG. 6, a third embodiment is now described with reference to the formation of an enhancement mode GaN transistor. FIG. 6 illustrates a cross-sectional view of the device 400. The third embodiment is essentially a combination of the first and second embodiments described above, and includes two diffusion barrier layers 48, 49, one of either side of the barrier layer 47. The dimensions and compositions of the various layers are similar to that of the first and second embodiments.

Figure 7:
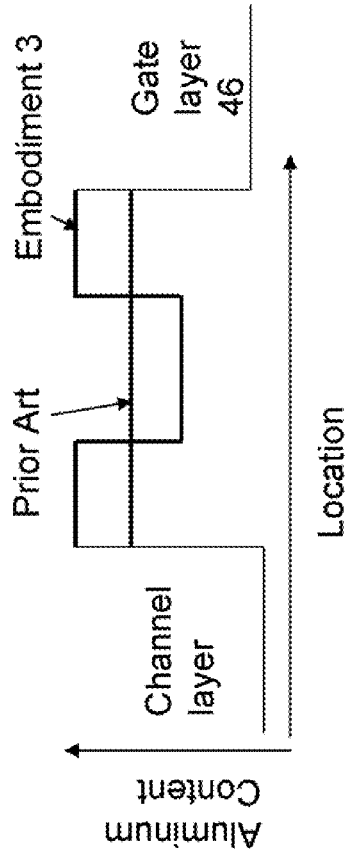
FIG. 7 is a schematic representation comparing the aluminum content in conventional GaN transistors and the device of FIG. 6.

This embodiment has the advantages of both the first and second embodiments described above. The structure of FIG. 6 has a triple layer of different Al contents with higher Al content close to the gate layer and higher Al content near the channel layer. A comparison of Al content between the buffer layer and gate layer in a conventional GaN transistor and the structure of FIG. 6 is shown in FIG. 7. In the structure shown in FIG. 6, the diffusion layer 49 above the channel layer is high in Al, while the barrier layer 47 is of lower Al content, and the other diffusion layer 48 is again of high Al content. The high Al content material of layer 48 blocks diffusion of Mg, and confines it to regions above the barrier layers. The high Al content material of layer 49 leads to higher electron mobility.

Figure 8:
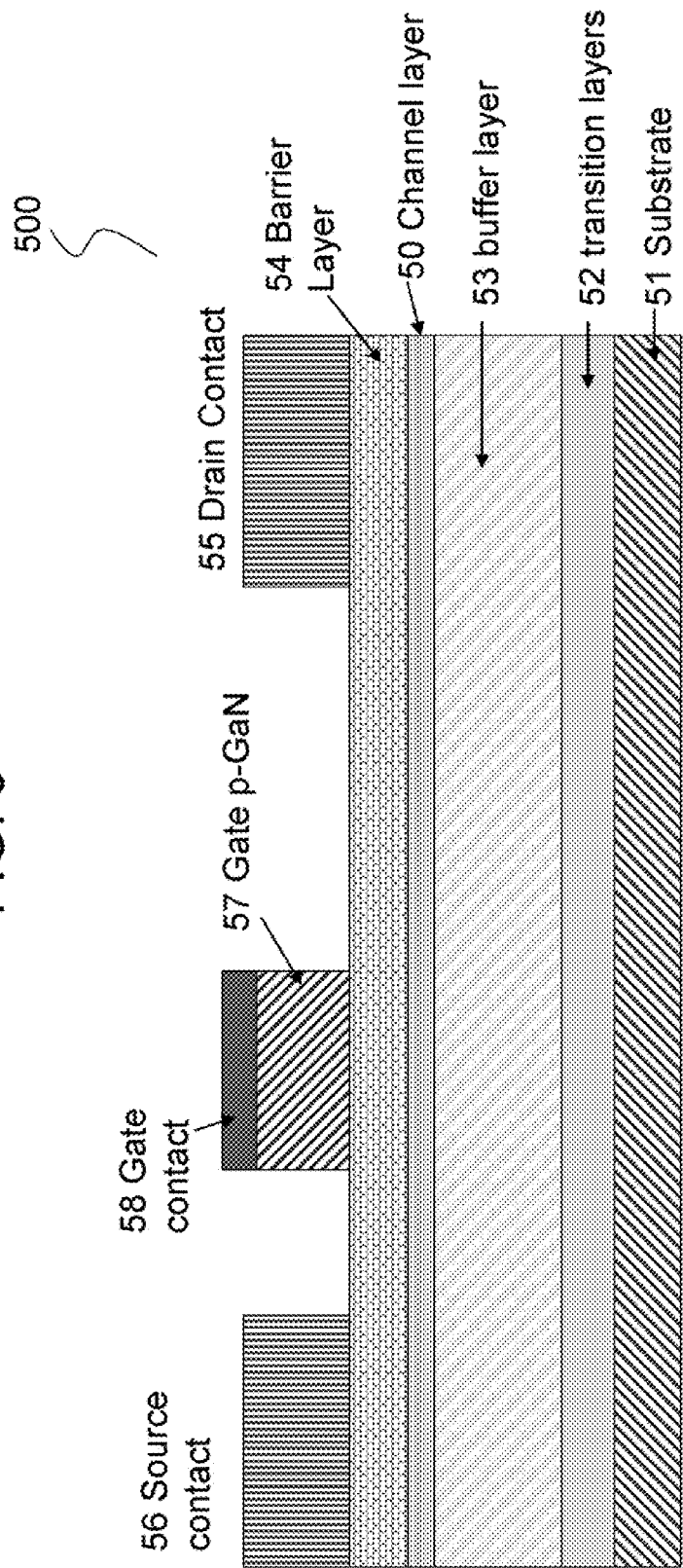
FIG. 8 illustrates a cross-sectional view of an enhancement mode GaN transistor device formed according to a fourth embodiment of the present invention.

Referring to FIG. 8, a fourth embodiment is now described with reference to the formation of an enhancement mode GaN transistor. FIG. 8 illustrates a cross-sectional view of the device 500. This embodiment is similar to the first and second embodiments described above, but has a p-type GaN gate with a Mg doping profile and does not have diffusion barrier layers. The gate layer 57 in this embodiment has lower Mg concentration near the barrier layer 54 and higher Mg concentration near the gate contact 58. Typical values for Mg concentration in gate layer 57 are about $10^{16}$ atoms per $cm^3$ near the barrier layer, increasing to about $5\times10^{19}$ atoms per $cm^3$ at the gate contact.

Figure 9:
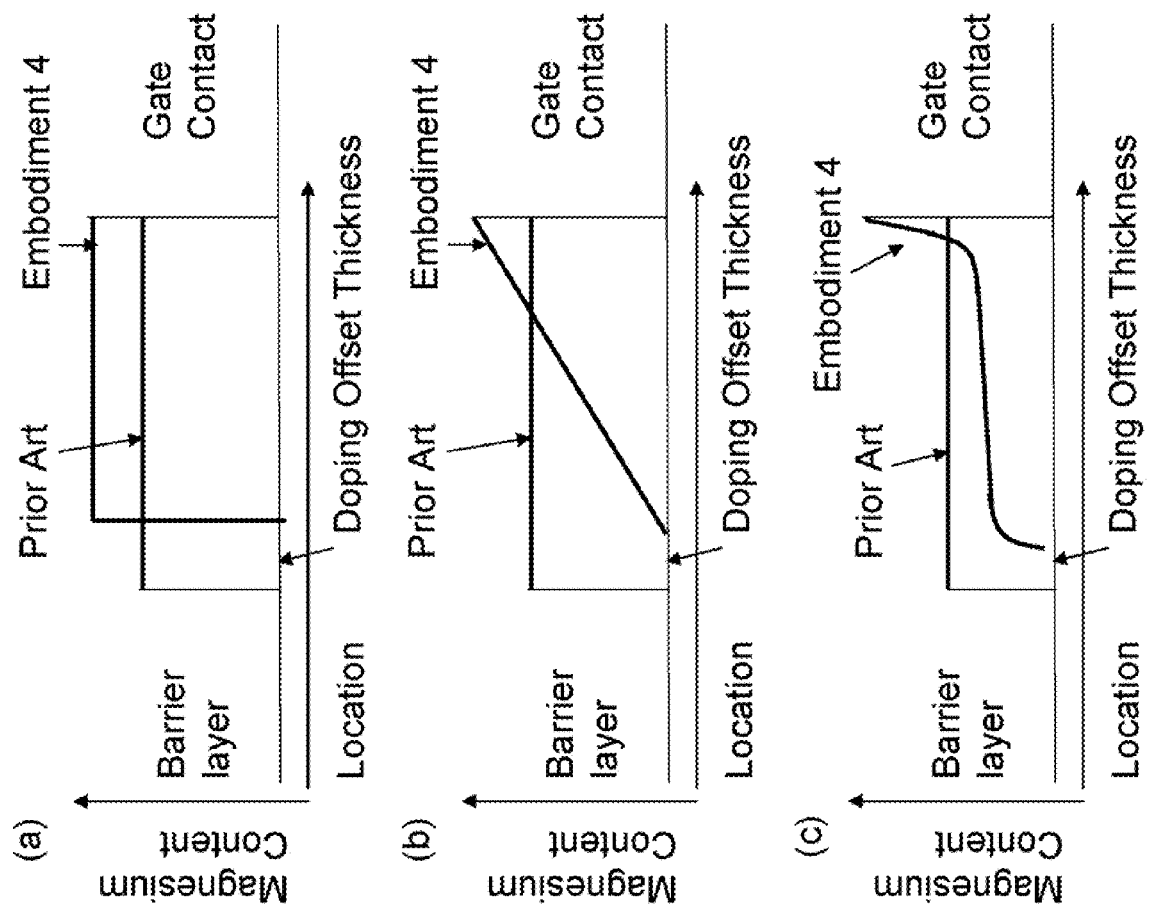
FIG. 9 is a schematic representation comparing the magnesium content in conventional GaN transistors and the device of FIG. 8.

In accordance with the above-described embodiment, the Mg doping level of the gate layer 57 is low near the barrier layer 54, and higher near the gate contact 58. This is shown in FIG. 9 with comparison to a conventional GaN transistor. The structure in FIG. 8 has higher Mg content close to the gate layer. The Mg concentration level can begin at zero or a low level, e.g., about $10^{16}$ atoms per $cm^3$, and then increase towards the gate contact. The shape of the Mg concentration through the p-type GaN gate layer 57 can vary in a number of ways, some of which are shown in FIG. 9 (e.g., a linear graded Mg concentration or a spiked Mg concentration near the gate contact). Included in these are versions in which there is a spacer layer above the barrier that does not contain Mg. Associated with this low Mg region is a doping offset thickness. The structure of FIG. 8 has various advantages. The low Mg concentration near the barrier layer reduces the back diffusion into the barrier layer. Combined with a doping offset, very low unintentional doping of the barrier layers and the buffer layers can be achieved. The high Mg concentration near the gate contact helps create an ohmic contact between the gate contact and p-type GaN that leads to improved device turn on characteristics.

Figure 10:
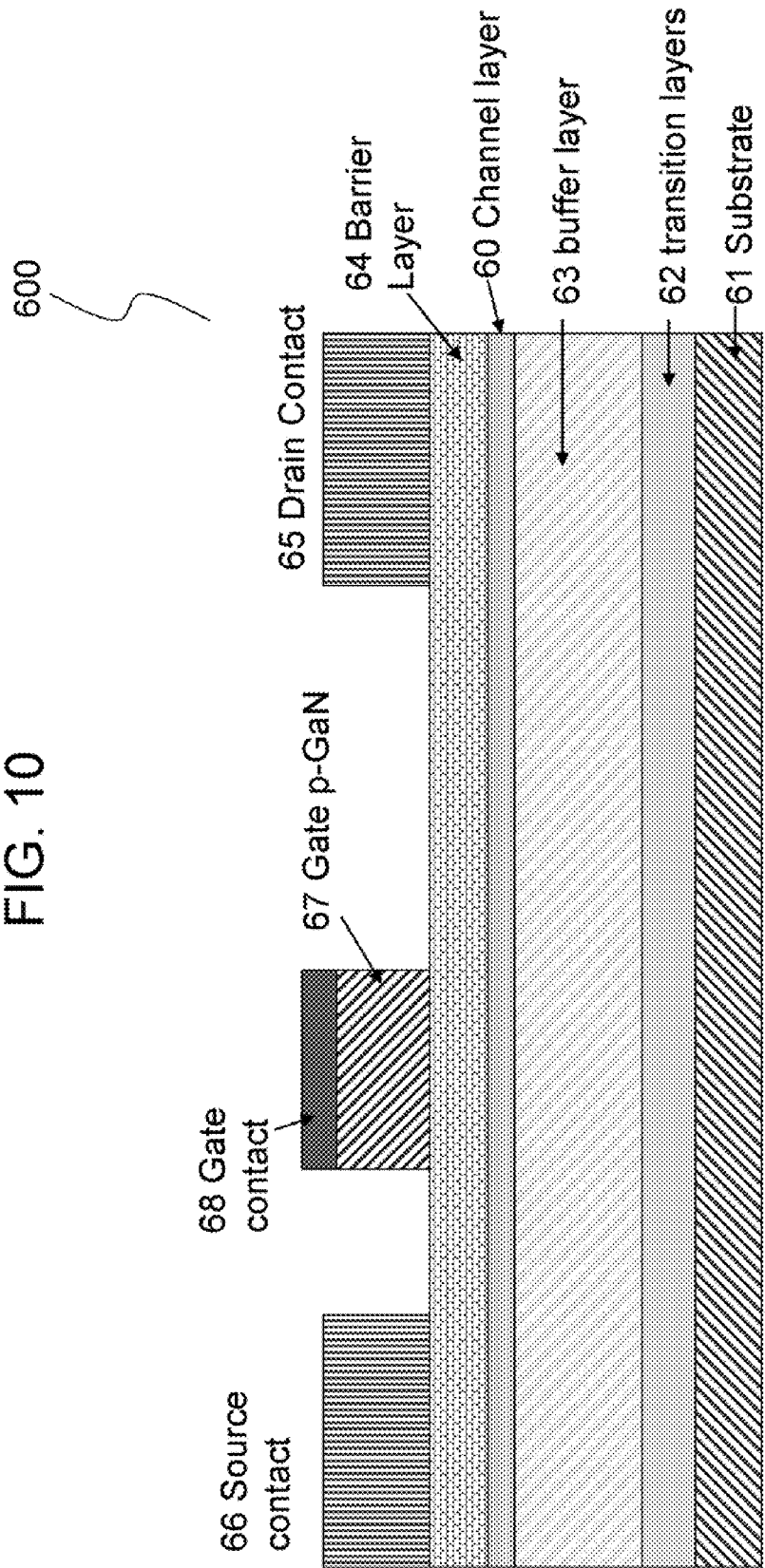
FIG. 10 illustrates a cross-sectional view of an enhancement mode GaN transistor device formed according to a fifth embodiment of the present invention.

Referring to FIG. 10, a fifth embodiment is now described with reference to the formation of an enhancement mode GaN transistor. FIG. 10 illustrates a cross-sectional view of the device 600. This embodiment is similar to the fourth embodiment, except that the Mg doping profile of the p-type GaN gate layer 67 is different. The gate layer 67 in this embodiment has a lower Mg concentration near the barrier layer 64 and near the gate contact 68, with an increased concentration in the middle. Typical values for Mg concentration are about $10^{16}$ atoms per $cm^3$ near the barrier layer, increasing to about $5\times10^{19}$ atoms per $cm^3$ near the center of the p-GaN gate, and decreasing to about $10^{16}$ atoms per $cm^3$ near the gate contact.

Figure 11:
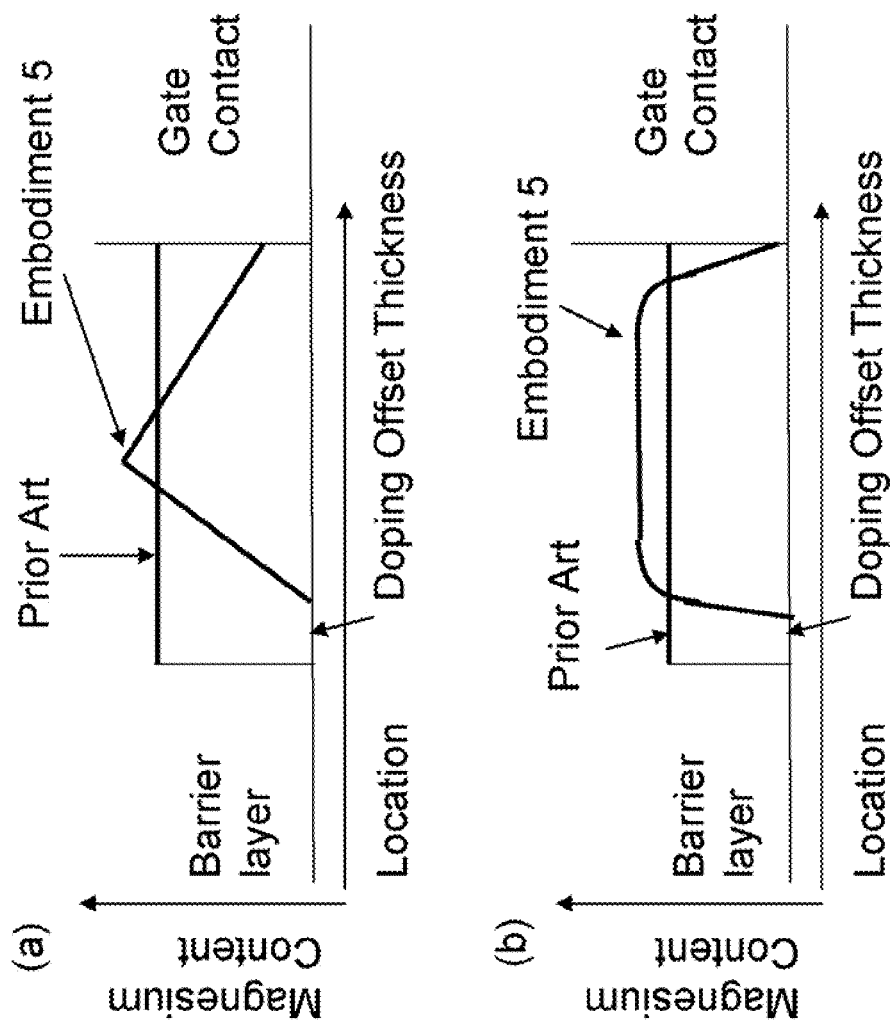
FIG. 11 is a schematic representation comparing the magnesium content in conventional GaN transistors and the device of FIG. 10.

In accordance with the above-described embodiment, the Mg doping level is low near the barrier layer and higher near the center of the gate. This is shown in FIG. 11 with comparison to a conventional GaN transistor. The shape of the Mg concentration through the p-type GaN layer can vary in a number of ways, some of which are shown in FIG. 11 (e.g., a peaked Mg concentration or a flat topped Mg profile). The structure of FIG. 10 has higher Mg content in the center of the gate layer. The low Mg concentration near the barrier layer reduces the back diffusion into the barrier layer. Combined with a doping offset, very low unintentional doping of barrier, channel, and buffer layers can be achieved. The low Mg concentration near the gate contact allows formation of a Schottky contact between the gate contact and p-type GaN that leads to improved device gate leakage.

Figure 12:
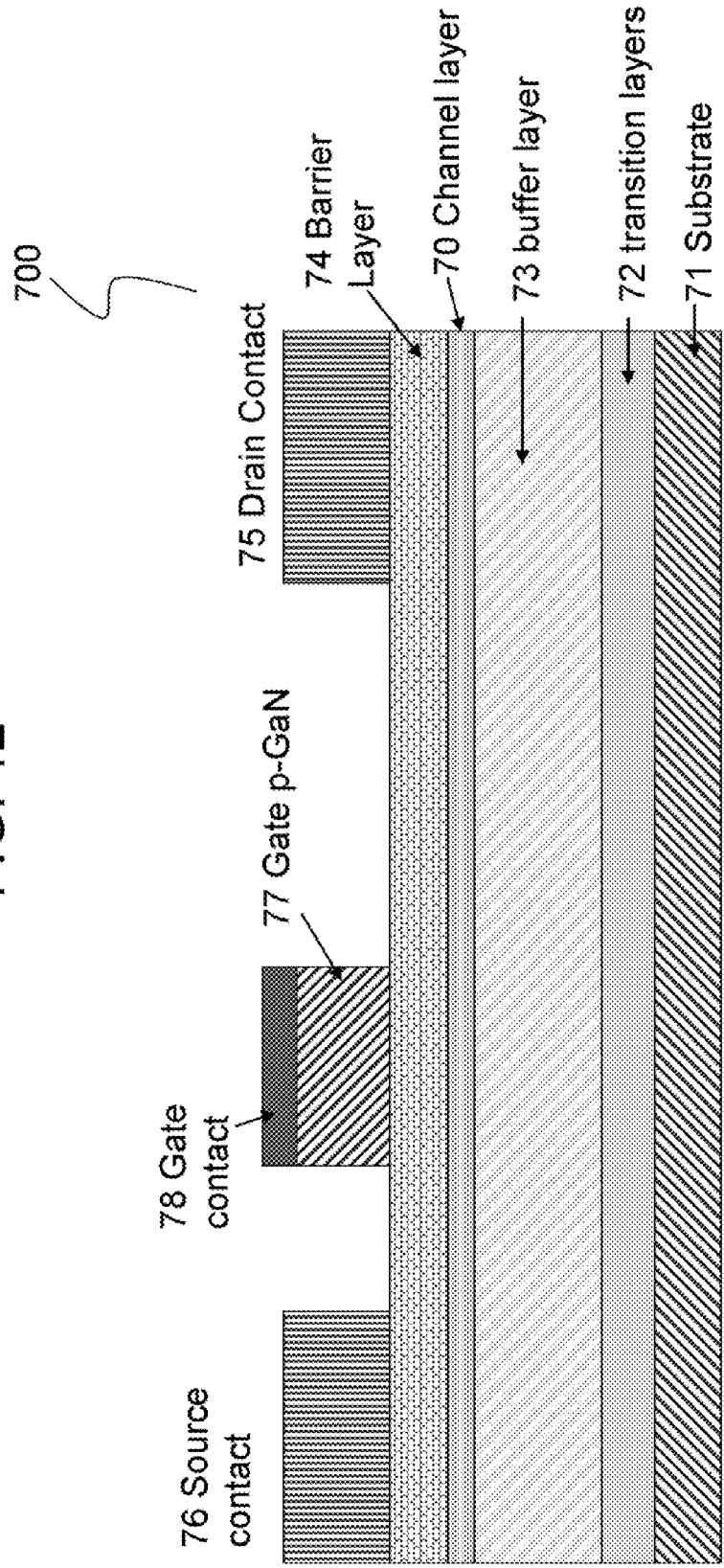
FIG. 12 illustrates a cross-sectional view of an enhancement mode GaN transistor device formed according to a sixth embodiment of the present invention.

A sixth embodiment is now described with reference to the formation of an enhancement mode GaN transistor. FIG. 12 illustrates a cross-sectional view of the device 700. This embodiment is similar to the fifth embodiment, except that n-type doping is provided through addition of Si in gate layer 77 near the gate contact. Typical values for Mg concentration are similar to the fifth embodiment. Si concentration near the gate contact can rage from about $10^{15}$ to about $10^{19}$ atoms per $cm^3$.

Figure 13:
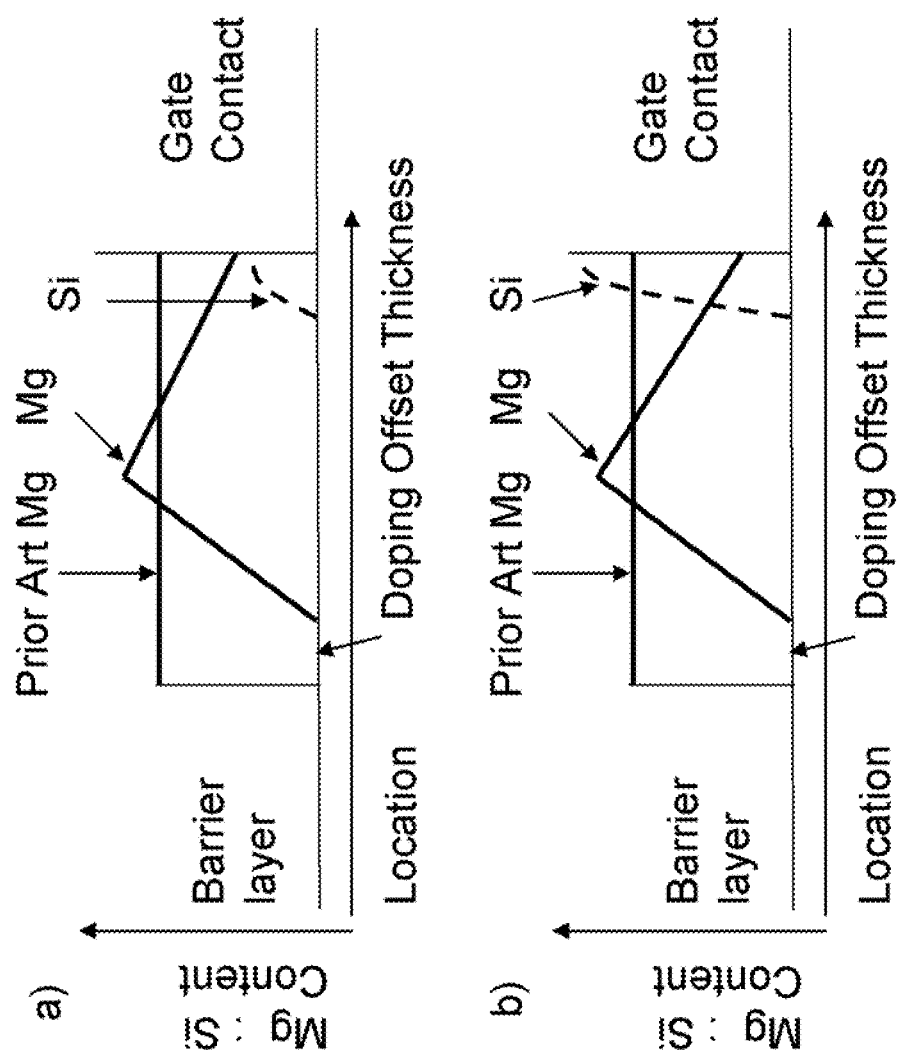
FIG. 13 is a schematic representation comparing the magnesium content in conventional GaN transistors and the device of FIG. 12.

In accordance with the above-described embodiment, the Mg doping level is low near the barrier layer and higher near the center of the gate. Si atoms are added near the gate contact. This is shown in FIG. 13 with comparison to a conventional GaN transistor. The low Mg concentration near the barrier layer reduces the back diffusion into the barrier layer. Combined with a doping offset, very low unintentional doping of barrier, channel, and buffer layers can be achieved. The low Mg concentration near the gate contact results in a low hole density. The hole density is further reduced by the addition of Si atoms. Part A of FIG. 13 illustrates the addition of Si atoms to reduce the density of holes. The density of Si atoms is less than or equal to the density of Mg atoms. This very low hole density improves the formation of a Schottky contact. Further increasing the Si content beyond the level of Mg, results in a p-n junction. Part B of FIG. 13 illustrates the addition of Si atoms far beyond the density of Mg atoms near the gate contact. This results in a p-n junction within the gate structure and can lead to further reduction in gate leakage.

Figure 14:
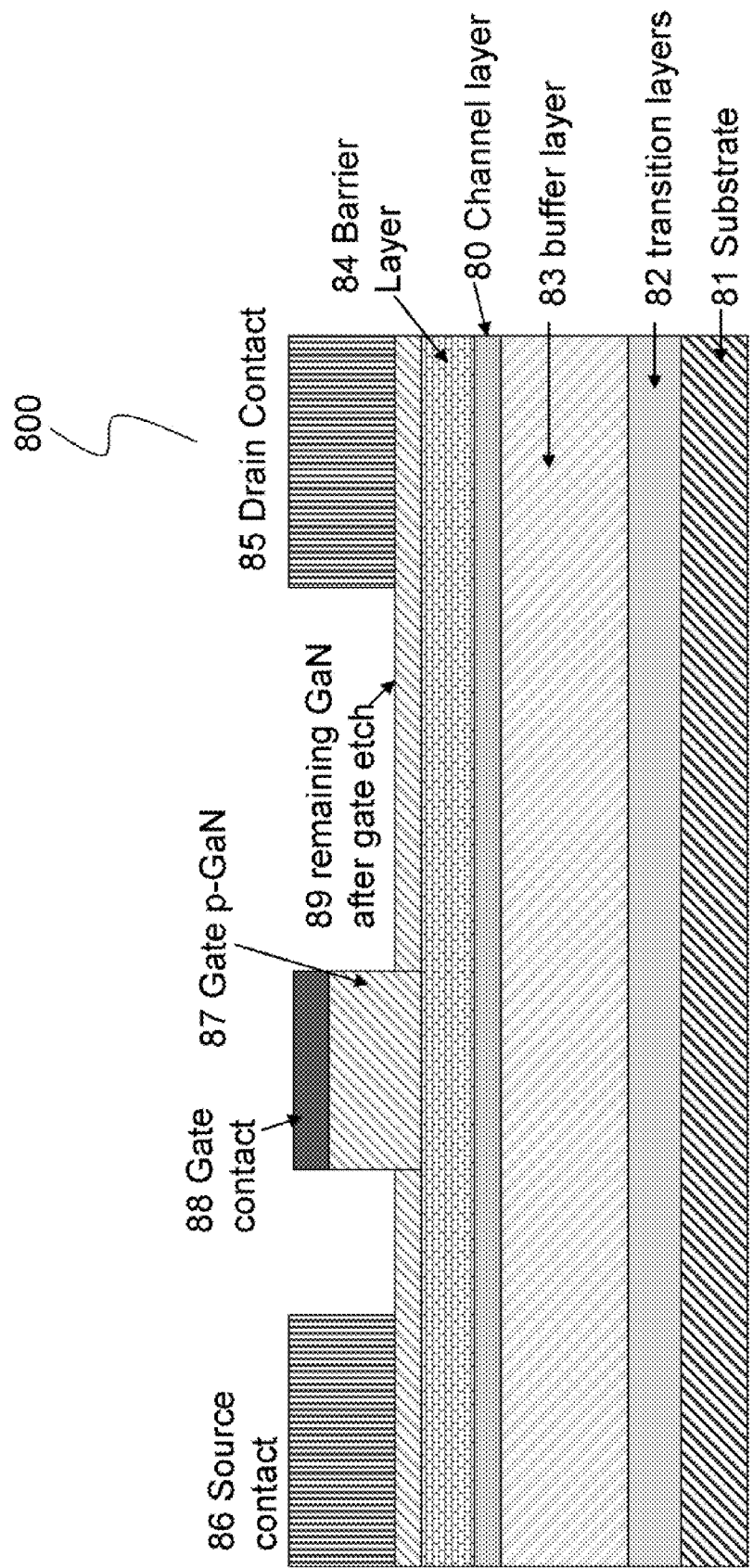
FIG. 14 illustrates a cross-sectional view of an enhancement mode GaN transistor device formed according to a seventh embodiment of the present invention.
Figure 15A:
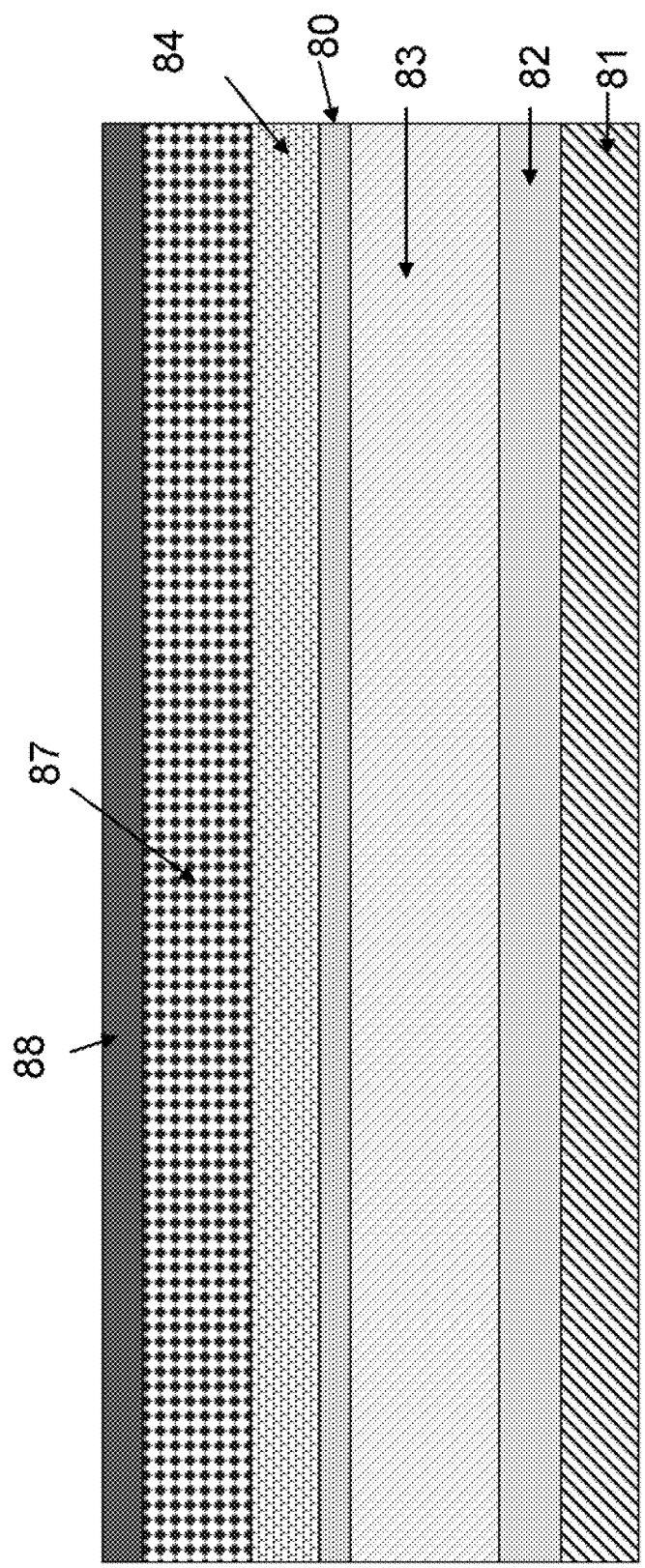
FIGS. 15A-15D illustrate a method of forming an enhancement mode GaN transistor device according to an embodiment of the present invention.
Figure 15B:
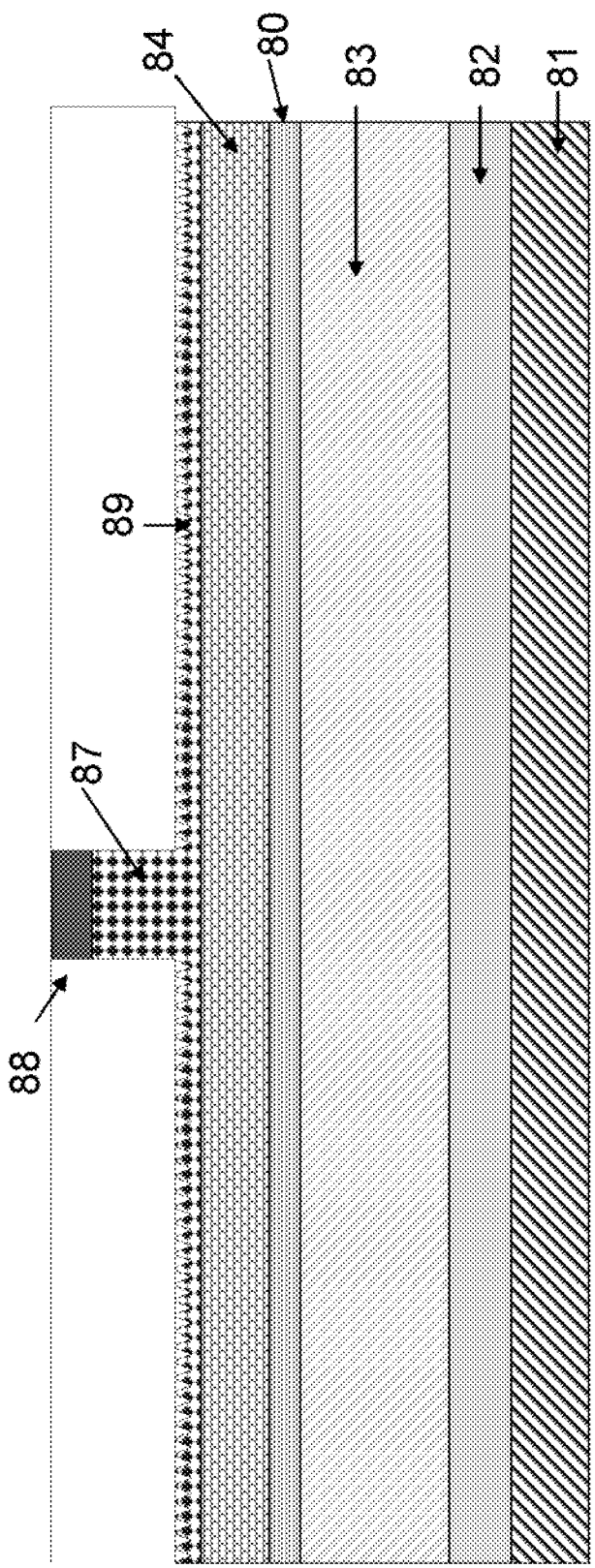
Figure 15C:
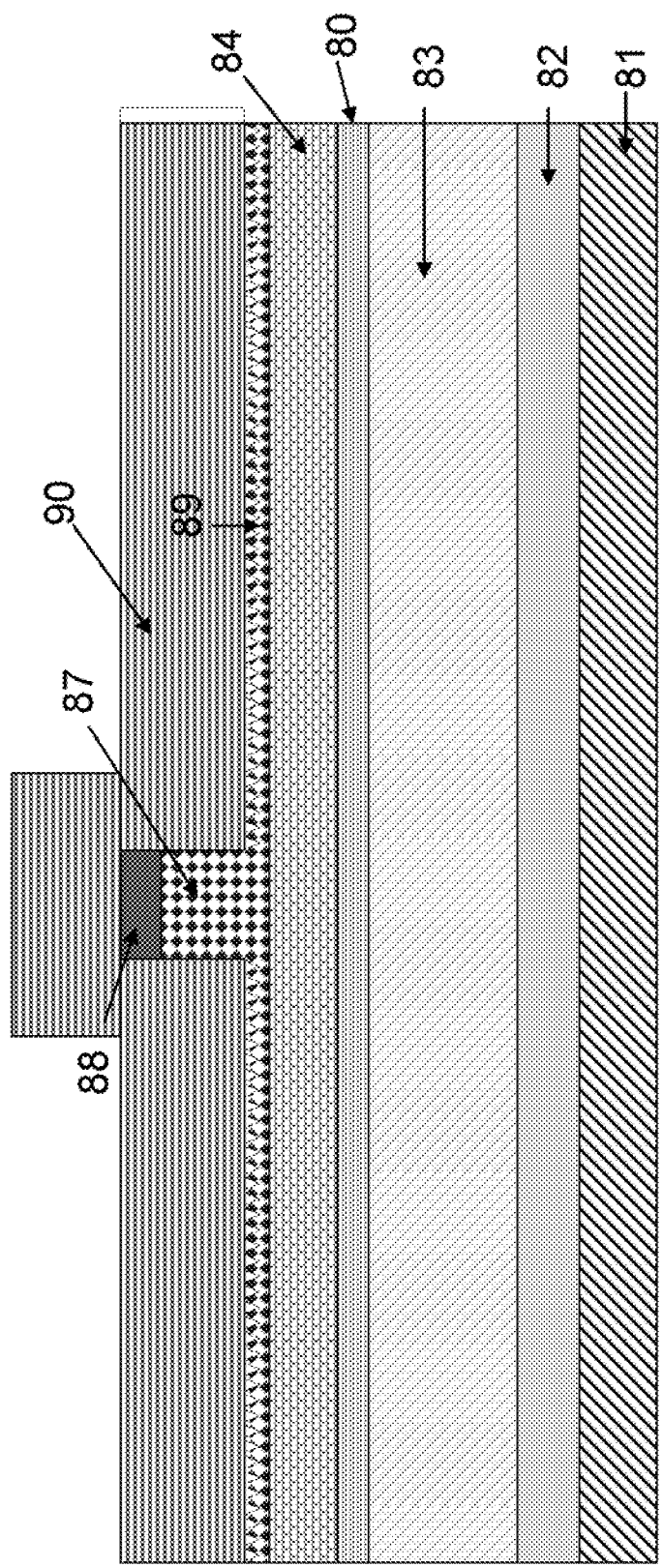
Figure 15D:
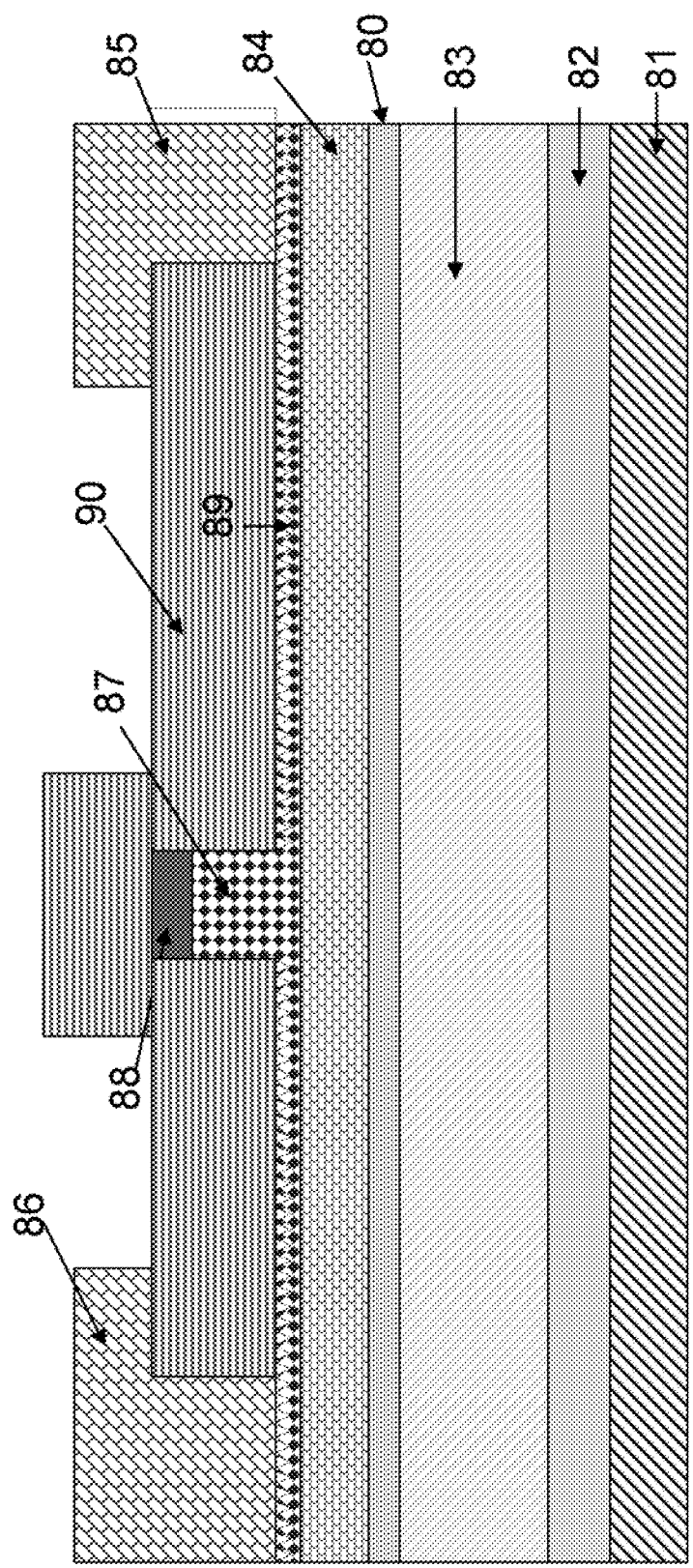

A seventh embodiment is now described with reference to the formation of an enhancement mode GaN transistor. FIG. 14 illustrates a cross-sectional view of the device 800. This embodiment is similar to the fifth and sixth embodiments, except that region 89, composed of a portion of the spacer layer, remains above the barrier layer in the region outside the gate region. Typical values of layer 89 thickness are about 0% to about 80% of the spacer layer thickness.

An additional advantage of the low doped or undoped layer is a reduction in damage from manufacturing, and an improvement in manufacturing tolerances. Referring to FIGS. 15A-15D, the steps in fabrication consist of: (a) deposition of AlN and AlGaN transition layers 82 on substrate 81, GaN buffer layer 83, channel layer 80, barrier layer 84, p-GaN layer 87, and gate contact material 88; (b) etching of the gate contact and most of the p-GaN layer 87 leaving a small amount of material 89; (c) passivation of the surface through deposition of an insulating material such as SiN 90; and (d) etching open contact area and depositing ohmic contact material to form source 86 and drain 85. The advantage is achieved in step (b). During the etch of p-GaN, the etching is stopped before reaching the barrier layer. This is done to avoid causing damage to this sensitive material that can result in high resistivity in the channel layer, and trapping of charge at the SiN interface. Without use of the low doped spacer layer, layer 89 is composed of p-GaN. This leads to negative charge in layer 89 that repels electrons from the channel layer and increases resistance to current flow when the device is on. The use of an undoped spacer layer allows the etching of step (b) to terminate above the barrier layer, thus avoiding damage, without leaving highly doped material that is detrimental to resistance of the channel layer. The spacer layer may be grown at a very high temperature (around 1000° C. to around 1100° C.), grown at around 900° C. with high ammonia, and/or grown very slowly.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

We claim:
1. An enhancement-mode III Nitride transistor comprising:
a substrate;
transition layers;
a buffer layer comprised of a III Nitride material;
a barrier layer comprised of a III Nitride material and having an Al fraction;
drain and source contacts;

a gate comprising:
  a III Nitride layer containing at least one p-type dopant; and
  a contact layer located over the III Nitride layer; and
a diffusion barrier layer disposed between the gate and the barrier layer, the diffusion barrier layer comprised of a III Nitride material and having an Al fraction, the entirety of the diffusion barrier layer being located over the barrier layer, wherein the Al fraction of the diffusion barrier layer is greater than the Al fraction of the barrier layer.

2. The transistor of claim 1, wherein the buffer layer is comprised of $In_xAl_yGa_{1-x-y}N$, where $x+y<1$.

3. The transistor of claim 1, wherein the barrier layer is comprised of $In_xAl_yGa_{1-x-y}N$ of wider band gap than the buffer layer, where $x+y<1$.

4. The transistor of claim 1, wherein the p-type dopant is selected from the group consisting of Mg, C, Ca, Fe, Cr, V, Mn, and Be.

5. The transistor of claim 3, wherein the diffusion barrier layer is comprised of $In_xAl_yGa_{1-x-y}N$, where $x+y<1$.

6. The transistor of claim 5, wherein the III Nitride layer is an $In_xAl_yGa_{1-x-y}N$ layer, where $x+y<1$.

7. The transistor of claim 1, further comprising a channel layer located between the diffusion barrier layer and the buffer layer.

8. The transistor of claim 1, further comprising an additional diffusion barrier layer having an Al fraction, the entirety of the additional diffusion barrier layer being located below the barrier layer, wherein the Al fraction of the additional diffusion barrier layer is greater than the Al fraction of the barrier layer.

9. An enhancement-mode III Nitride transistor comprising:
  a substrate;
  transition layers;
  a buffer layer comprised of a III Nitride material;
  a barrier layer comprised of a III Nitride material;
  drain and source contacts; and
  a gate comprising:
    a III Nitride layer, the III Nitride layer having a first region and a second region each having a p-dopant concentration, wherein the p-type dopant concentration of the first region is less than the p-type dopant concentration of the second region, the entirety of the III Nitride layer being located above the barrier layer; and
    a contact layer located over the III Nitride layer.

10. The transistor of claim 9, wherein the buffer layer is comprised of $In_xAl_yGa_{1-x-y}N$, where $x+y<1$.

11. The transistor of claim 9, wherein the barrier layer is comprised of $In_xAl_yGa_{1-x-y}N$, where $x+y<1$.

12. The transistor of claim 9, wherein the III Nitride layer further comprises a third region located above the second region, the third region having a p-type dopant concentration.

13. The transistor of claim 12, wherein the p-type dopant concentration of the third region is greater than the p-type dopant concentration of the second region.

14. The transistor of claim 12, wherein the p-type dopant concentration of the third region is less than the p-type dopant concentration of the second region.

15. The transistor of claim 12, wherein the third region has an n-type dopant concentration.

16. The transistor of claim 15, wherein the n-type dopant concentration of the third region is greater than the p-type dopant concentration of the third region near the top of the third region, and wherein the n-type dopant concentration is less than the p-type dopant concentration of the third region near the bottom of the third region.

17. The transistor of claim 15, wherein the third region has an n-type dopant concentration that is less than the p-type dopant concentration of the third region.

18. The transistor of claim 9, wherein the III Nitride layer has an undoped fourth region located below the first region.

19. The transistor of claim 9, wherein the second region is located above the first region.

* * * * *